3,168,401

LIGHT SENSITIVE DIAZO SULFONATE MATERIAL AND PREPARATION OF PRINTING PLATES THEREWITH

Oskar Sus, Wiesbaden-Biebrich, Germany, assignor, by mesne assignments, to Azoplate Corporation, Murray Hill, N.J.

No Drawing. Continuation of application Ser. No. 685,408, Sept. 23, 1957. This application July 29, 1963, Ser. No. 298,427
Claims priority, application Germany, June 18, 1954, K 22,579
32 Claims. (Cl. 96—33)

The present invention relates to the production of light-sensitive material suitable for use in the graphic arts. More particularly, it relates to the manufacture of lithographic printing plates and to light-sensitive material suitable therefor.

It has previously been suggested to prepare presensitized lithographic printing plates using certain water-soluble and water-insoluble diazo compounds as the light-sensitive substance.

It is an object of this invention to provide still another group of diazo compounds of this type which are characterized by excellent storageability while having a simple chemical constitution. A further object of the invention is the use of certain diazo sulfonates in light-sensitive material which become colored upon exposure to light without the previous addition of dyestuffs or azo components.

The light-sensitive material, according to the present invention, is characterized in that its light-sensitive layer consists of diazo sulfonates of cyclic amines (aromatic as well as heterocyclic) in which the salt-forming cationic component is an aromatic, hydroaromatic or heterocyclic amine with a primary amino group.

It is believed that the light sensitive material of the present invention owes its excellent storageability to the fact that the diazo sulfonates have stability which exceeds that of other diazo compounds. As a further advantage deriving from the greater stability of the light sensitive substances of the present invention, it is now found to be more convenient to handle the new light sensitive material as well as the diazo sulfonates in manufacturing the new material.

The diazo sulfonate derivates constituting the light-sensitive layer, in accordance with the present invention, are prepared by means of an exchange of the cation of an alkali-metal diazo sulfonate with an organic primary base, according to the following reaction scheme:

$$R{-}N{=}N{-}SO_3Na + XH\cdot H_2NR_1 \rightarrow R{-}N{=}N{-}SO_3H\cdot H_2NR_1 + NaX$$

wherein:

R and $R_1$ are aryl, substituted aryl or heterocyclic radicals, and

X is the anion of an acid.

There are a great number of diazo sulfonates conforming to the expression $R{-}N{=}N{-}SO_3Na$ which may be considered for the preparation of the diazo sulfonate derivatives to be used as light-sensitive substances according to the present invention. With regard to the usefulness of the printing plates prepared from the light sensitive metal foils, it is preferred that the diazo sulfonates $R{-}N{=}N{-}SO_3Na$ contain neither strongly basic groups nor groups that render them water-soluble, such as $SO_3H$ or COOH. Furthermore, the degree of light sensitivity and the stability of the diazo sulfonates $$R{-}N{=}N{-}SO_3Na$$

should also be considered. The better their light sensitivity and their stability, the better is the light sensitivity and stability of the diazo sulfonate derivatives which are obtained therefrom.

In general, the diazo sulfonates of the following compounds have proved useful: amino carbazoles, amino-diphenylene-oxides; 4-amino-diphenyl-amine, p-phenylene-diamines that are acylated at a nitrogen atom and alkoxylated in their aromatic nucleus; and mono-amino compounds of alkoxylated diphenyl- and triphenyl-methane.

As the salt-forming organic base having the general formula $H_2N\cdot R_1$, preferably the primary amines of multinuclear compounds are used, because these amines are well suited to decrease the water solubility of the reaction products. Polyamino compounds, such as benzidine, dianisidine, diamin-diphenyl-methane, and triamino-toluol, have a special capacity for decreasing the water solubility of the reaction product when reacted with the alkali metal salts of diazo sulfonates. In the salts thus obtained, as many moles of the diazo compound, e.g. 2 or 3, are linked via the residue of the sulfonic acid to one mol of the base as there were amino groups previously contained in the base. Another method of preparing the diazo sulfonates of the present invention consists in causing the alkali-sulfonate of a tetrazo compound to react with 2 moles of an aromatic amino salt.

A metal is used as a support for the compounds of the present invention, preferably aluminum. It is not necessary to subject the metallic surface to an anodic oxidation or to a chemical treatment before coating it. However, it may be advantageous to roughen the surface by a simple mechanical treatment, e.g. sandblasting.

For the preparation of the light-sensitive material, the diazo sulfonate derivatives $R{-}N{=}N{-}SO_3H\cdot H_2NR_1$ are dissolved in organic solvents, such as alcohols, alcoholic ethers, dioxane, or dimethyl formamide, and the solutions are then coated onto the support by way of whirlcoating, spreading, or spraying. The resulting layers must be well dried, preferably at temperatures between 80–110° C. As a rule, the dried layers are yellow colored. They are, when dry, exposed to light under a transparent original, using one of the light sources customary in the printing art, preferably an arc lamp. Under the influence of light, the light struck areas of the layer change color; they turn yellow-brown to deep blue, depending on the respective sulfonate derivate used. It may be advisable to add alkali-soluble phenol formaldehyde resin, rosin, or shellac, as these additions favor the formation of a smooth layer on the support and prevent crystallization of the light-sensitive substance in the layer.

The finished printing plate is obtained from the exposed foil by treating it with dilute aqueous solutions of alkaline substances, preferably of secondary or tertiary alkali metal salts of phosphoric acid, sodium carbonate, or sodium bicarbonate. Concentrations of 1–10% of the alkali metal salts have proved especially suitable. By this treatment, the unchanged light sensitive substance is removed, whereas the light decomposition product remains on the plate. From a negative original a colored positive image is obtained, which is clearly visible against the metallic background with a good contrast. Since the light decomposition product has oleophilic properties, the image may be inked with greasy ink after a short rinsing with water, dilute acids, or the usual acid fixing agents. In some cases, spraying the exposed layer with water may be sufficient to remove the undecomposed material from the non-imaged areas, e.g. the non-light struck areas.

The diazo sulfonate derivates $$R{-}R{=}N{-}SO_3H\cdot H_2NR_1$$

are prepared by reaction of the alkali metal diazo sulfonates (R—R=N—$SO_2$+alkali metal) with aqueous solutions of salts of suitable organic bases, preferably in the form of the hydrochlorides of the bases. The diazo sulfonate derivatives which are easily soluble in organic solvents, and difficultly soluble or completely insoluble in water, separate from the reaction solution as a yellow colored precipitate and can be purified by recrystallization from organic solvents. By the influence of light they are turned into compounds which, contrary to the light-sensitive diazo sulfonate derivatives themselves, cannot be retransformed into water-soluble alkali sulfonate derivatives by means of dilute alkaline solutions and cannot be hydrolized by treating them with water. Thus, a selective separation of the relatively chemically inactive light decomposition products from the undecomposed diazo sulfonic acid salts can be attained by treating the exposed layer with water or a dilute alkaline solution.

I have not been able to ascertain with certainty the kind of reaction that leads to the formation of the light decomposition product. It can probably be assumed that under the influence of light the diazo sulfonate derivative is first turned into a compound which is capable of coupling. If diazo sulfonate derivates are used which contain an organic base as a salt-forming component that is capable of coupling, dyes are formed in the exposed areas. These dyes are identical with the azo dyes formed by coupling salt-forming bases with the diazo compounds from which the sulfonates are derived. Thus, images of a deep blue or red color are obtained.

The formation of colored images upon exposing the light-sensitive material, according to the present invention, is of considerable technical interest since the exposing step as well as the developing step can be easily observed by watching the increasing coloring in the exposed areas. Heretofore, colored images could be obtained from diazo sulfonates suitable for reproduction only by adding azo components or complete dyes to the diazo sulfonates.

The following compounds are discussed in further detail in the examples.

(1)

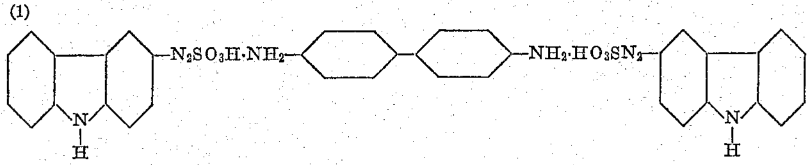

(2)

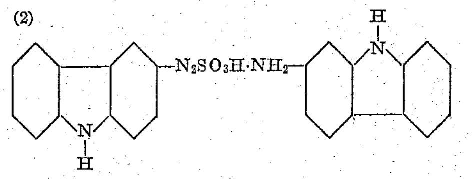

(3)

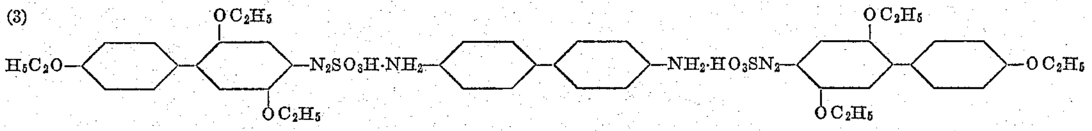

(4)

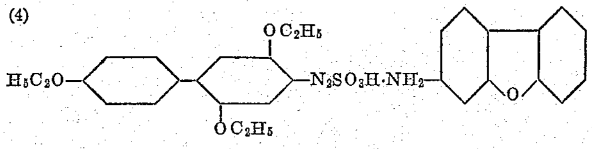

(5)

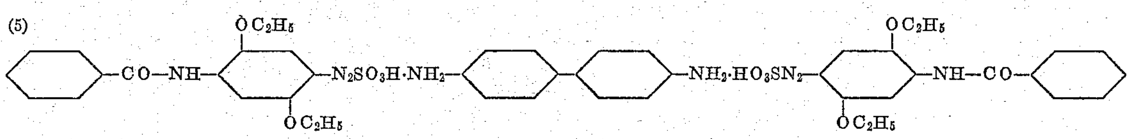

(6)

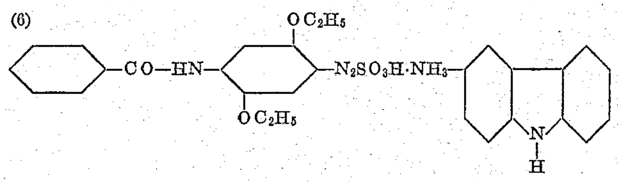

(7)

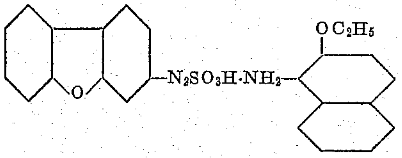

(8)

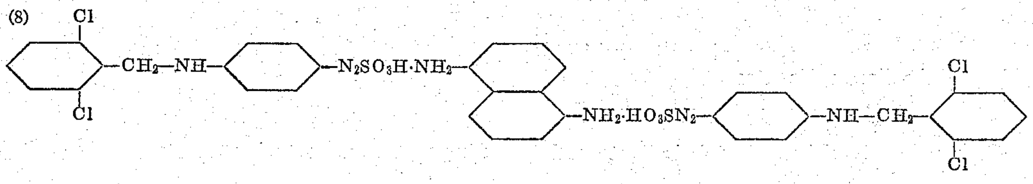

(9)
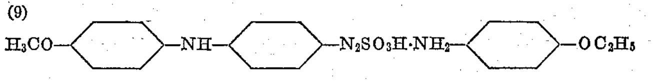

(10)
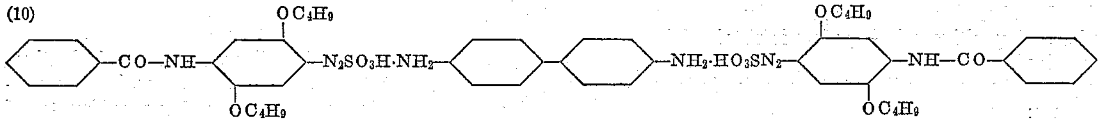

(11)
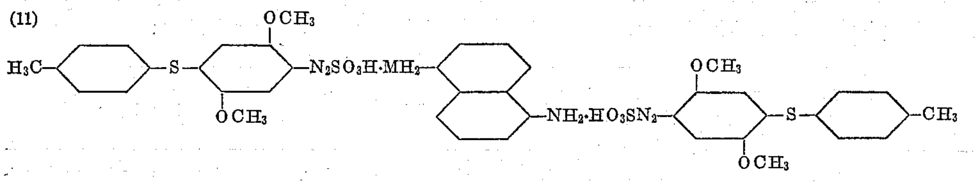

(12)
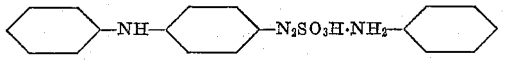

(13)
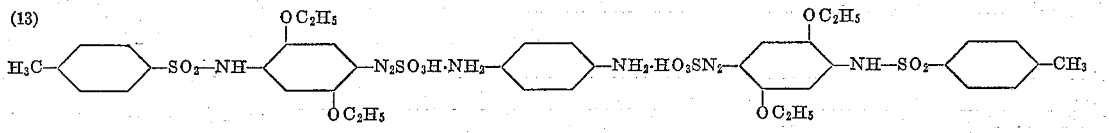

(14)
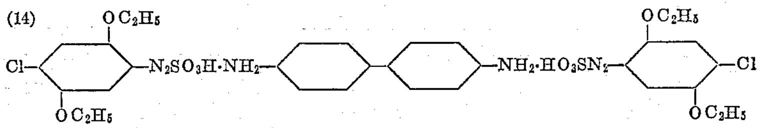

(15)
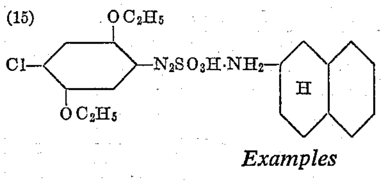

*Examples*

(1) An aluminum foil is coated by means of a plate-whirler with a 1 percent solution of the diazo sulfonate derivative corresponding to Formula 1 in glycol monomethyl ether, and the coated layer is then dried by means of warm air. For complete removal of the solvent, the foil is then again dried for about 5 minutes at a temperature of 90° C. The coated side of the foil is then exposed for 1–2 minutes under a transparent negative pattern, using an 18 amp. carbon arc lamp at a distance of 70 cm. A weakly blueish colored positive image becomes visible against a greenish yellow background. To develop the image, the foil is wiped over with a cotton swab soaked in a 1–10 percent trisodium phosphate solution; the unchanged yellow diazo sulfonate derivative is thereby removed in the unexposed areas. The foil is then rinsed with water, and the image side is further The compound corresponding to Formula 1 is prepared as follows:

2.97 parts by weight (1/100 mol) of the sodium diazosulfonate of 3-amino-carbazole are dissolved in 250 parts by volume of water, and to this solution is added, drop by drop, a solution prepared by dissolving while stirring 1.29 parts by weight (1/200 mol) of benzidine-hydrochloride in 55 parts by volume of water. The benzidine salt thus formed is almost insoluble in water and precipitates in the form of green-yellow crystals. The yield, after drying, is 82.5 percent of the theoretical quantity. The compound melts at 185–187° C. with decomposition.

In the same way, and with equally good results, printing plates may be produced by means of compounds prepared by analogy to the preparation of the compound corresponding to Formula 1 from the sodium diazo-sulfonate of 3-amino-carbazole and one of the bases listed in the following table:

| Base | Color of the Reaction Product | Melting Point of the Reaction Product (with Decomposition) | Solvent | Developer |
|---|---|---|---|---|
| 3,3'-dimethoxy benzidine | Lemon-yellow | 173–174° | Glycol monomethyl ether | 2–10% trisodium phosphate solution. |
| 2',5':2'',5''-tetramethoxy-4',4''-diamino-triphenyl methane. | Green-yellow | 150–160° after turning green | do | Do. |
| β-Aminonaphthalene | Brown yellow | 181–182° | do | 1–5% trisodium phosphate solution. |
| Aniline | Yellow green | 157° | do | 1% trisodium phosphate solution or 5% disodium phosphate solution. |
| 2-amino-carbazole (cf. Formula 2). | Yellow | Chars at 221–223° C. turns brown beginning at 170° C. | Ethylene glycol monomethyl ether. | Water or 0.5–1% solution of trisodium phosphate. |

treated with a 1 percent phosphoric acid solution. On inking with greasy ink, ink adheres to the positive image left on the foil, and the foil may now be used as a printing plate in a printing apparatus.

(2) 1 part by weight of the compound corresponding to Formula 3 (egg yolk-colored; melting point 137° C. with decomposition) and 0.2 part by weight of a non-hardenable, alkali-soluble formaldehyde-phenol-resin are dissolved in 100 parts by volume of glycol monomethyl ether. An aluminum foil, having a mechanically roughened surface on one side, is coated with this solution by analogy to Example 1. After exposure of the foil, the image is developed with a 2–10 percent trisodium phosphate solution. A positive printing plate is obtained from a negative original.

The compound corresponding to Formula 3 is prepared as follows:

4.2 grams of the diazo sulfonate sodium salt of the 2,5,4′-triethoxy-4-amino-diphenyl are dissolved in 400 cc. of water, and the filtered solution is then added to a solution of 1.3 grams of 4,4′-diamino-diphenyl-dihydrochloride in 120 cc. of water while mechanically agitating.

The diamino-diphenyl salt of the diazo sulfonate precipitates as a yellow substance. After recrystallization from ethanol the compound melts at 151° C. with decomposition.

Analogously, diazo sulfonate derivates are obtained from the sodium diazo-sulfonate of 2,5,4′-triethoxy-4-amino-diphenyl and one of the bases listed in the following table. These diazo sulfonate derivatives may be used, according to the present invention, as light sensitive substances for coating metal foils.

| Base | Color of the Reaction Product | Melting Point of the Reaction Product (with Decomposition) | Solvent | Developer |
|---|---|---|---|---|
| 3, 3′-dimethoxy-benzidine | Yellow | 134–136° C | Glycol mono-methyl ether/ dimethyl formamide (7:3). | 1% aqueous solution of trisodium phosphate. |
| p-Phenylene diamine | Eggyolk yellow | 152° | do | 0.5% aqueous solution of trisodim phosphate. |
| 2, 4, 6-triamino-toluene | Brown-yellow | 131–135° | Glycol monomethyl ether | Water or a 0.5% aqueous solution of trisodium phosphate. |
| 2-amino-diphenylene oxide (cf. Formula 4). | Yellow | 172° C | Ethylene glycol monomethyl ether. | 3–5% aqueous solution of trisodium phosphate. |

When one of the diazo sulfonates obtained from the three last mentioned bases is used, it is recommended that formaldehyde resin not be added for the coating of an aluminum foil.

(3) In a manner similar to that described in Example 1, an aluminum foil, having a mechanically roughened surface on one side, is coated with a diazo sulfonate salt corresponding to Formula 5 (egg yolk colored; turns dark when heated in excess of 155–165° C.) dissolved in a 1:1 mixture of glycol monomethyl ether and dimethyl formamide. A printing plate is obtained by exposing the sensitized foil and developing with a 5 percent disodium phosphate solution. The printing plate shows a positive image, when a negative transparent original is used. The copy of the original previously formed on the foil after exposure shows grey-brown lines on a yellowish background.

The compound corresponding to Formula 5 is prepared as follows:

4.15 grams of the diazo sulfonate sodium salt of 2,5-diethoxy-N-benzoyl-p-phenylene diamine are dissolved in 260 cc. of water and then added to a solution of 1.28 grams of 4,4′-diamino-diphenyl-dihydrochloride in 150 cc. of water while mechanically agitating.

The diamino-diphenyl salt of the diazo sulfonate precipitates as a yellow substance. After recrystallization from a dimethyl formamide/water mixture, it melts at 160–165° C. with decomposition.

With equally good results, diazo sulfonate derivatives may be used as light-sensitive substances which are prepared analogously from the sodium diazo sulfonate of 2,5-diethoxy-N-benzoyl-p-phenylene diamine and one of the bases listed in the following schedule:

| Base | Color of the Reaction Product | Melting Point of the Reaction Product (with Decomposition) | Solvent | Developer |
|---|---|---|---|---|
| p-p′-Diamino-diphenyl methane. | Eggyolk yellow | 150° | Glycol monomethyl ether | 0.5–1% aqueous solution of trisodium phosphate. |
| 2′,5′:2″,5″-tetramethoxy-4′,4″-diamino triphenylmethane. | Lemon-yellow | 144–145° | do | 5% aqueous solution of trisodium or disodium phosphate. |
| o,o-Dimethoxy-p-phenylene-diamine. | Brown yellow | 165° | Glycol monomethyl ether/ dimethyl formamide (1:1). | Water of 5% aqueous solution of disodium phosphate. |
| 2-amino-diphenyl-ether | Straw-yellow | 155–156° | Glycol monomethyl ether | 5% aqueous solution of disodium phosphate or 0.5% aqueous solution of trisodium phosphate. |
| Benzylamine | Eggyolk yellow | 194° | Glycol monomethyl ether/ dimethyl formamide (1:1). | Water. |
| Hexahydroaniline | Yellow | 199–200° | do | Do. |
| 3-amino-carbazole (cf. Formula 6). | Brownish yellow | Starts to decompose at 150° C. | Ethylene glycol monomethyl ether. | 0.5%–1% aqueous solution of trisodium phosphate. |

(4) One side of an aluminum foil with a mechanically roughened surface is coated by spreading upon it a 1 percent glycol monomethyl ether solution of the compound corresponding to Formula 7 (light yellow colored; melting point 240–255° C. with decomposition, after previous darkening). The layer is allowed to dry for a while, and is then further dried for 5 minutes at a temperature of 90° C. by means of hot air. The foil is then exposed under a negative transparent pattern, the light source being a mercury vapor lamp. The light struck areas of the layer turn to a bright, deep blue color. The unexposed parts of the layer are removed by means of a 5–10 percent disodium phosphate solution. The developed foil is then shortly wiped over with 1 percent phosphoric acid, whereupon the positive image thus obtained may be inked with greasy ink and used as a printing plate.

The compound corresponding to Formula 7 is prepared as follows:

2.9 grams of the diazo sulfonate sodium salt of the 2-amino-diphenyleneoxide are dissolved in 2000 cc. of water and, while mechanically agitating, the solution is mixed with a solution of 2.2 grams of 1-amino-2-naphthol-ethyl-ether-hydrochloride in 150 cc. of water.

The amino-naphthol-ethyl ether salt of the diazo sulfonate precipitates as a yellow substance. After recrystallization from ethanol, to which some water was added, it melts at 245–255° C. with decomposition.

In order to produce a distinctly colored image, the diazo sulfonate derivative may be used which is obtainable from the sodium diazo sulfonate of 2-amino-diphenyleneoxide and β-naphthylamine-chlorohydrate. This compound is straw-colored, turns brown gradually when heated to 180° C. and chars at 235–240° C. The compound is advantageously dissolved in a 1:9 mixture of dimethyl formamide and glycol monomethyl ether, prior to coating on an aluminum foil. After exposure under a transparent pattern, a weakly reddish-brown image becomes visible, which can be developed with water.

(5) An aluminum tape with a roughened surface is continuously coated from a feed tub with a 1 percent solution of the compound corresponding to Formula 8 (dark greenish-yellow colored; melting point 151–153° C. with decomposition) dissolved in a 1:1 mixture of isopropyl alcohol and glycol monomethyl ether. After drying, the coated roll is cut into sections, and the cuttings are then exposed as usual under transparent originals and developed by means of a 1 percent trisodium phosphate solution. Reverse images of the originals are obtained. After development, the images are treated with an aqueous solution containing 8 percent dextrine, 1 percent phosphoric acid, and 1 percent formaldehyde. They may then be inked with greasy ink and used as printing plates.

The compound corresponding to Formula 8 is prepared as follows:

3.82 grams of the diazo sulfonate sodium salt of the N-2, 6-dichloro-benzyl-p-phenylene diamine are dissolved in 140 cc. of water, and while mechanically agitating, the solution is mixed with a solution of 1.16 grams of 1,5-diamino-naphthalene-dihydrochloride in 70 cc. of water. The diamino naphthalene salt of the diazo sulfonate precipitates as a greenish-yellow substance. After recrystallization from acetone, to which some water was added, it melts at 151–153° C. with decomposition.

Instead of the compound corresponding to Formula 8, there may be used as a light sensitive substance the diazo sulfonate derivative obtained from 2 moles of the sodium diazo sulfonate of N-2,6-dichlorobenzyl-p-phenylene-diamine and 1 mole of 2′,5′:2″,5″-tetramethoxy-4′,4″-diamino-triphenyl methane (hydrochloric acid salt). This compound is of greenish-yellow color and melts at 92–95° C. with decomposition. For the preparation of the light-sensitive layer, it is dissolved in glycol monomethyl ether. On exposing under an original, a weakly colored yellow-brown image becomes visible, which is developed by means of a 2–5 percent trisodium phosphate solution.

In the following table, the components are listed for the preparation of further diazo sulfonate salts which may be used as light-sensitive substances, in accordance with the present invention, and lead to good printing plates:

The compounds listed in the schedule are prepared by analogy to the preparation of the compound corresponding for Formula 1 as described column 3 i.e. the sodium salts of the diazo sulfonates are caused to react with the hydrochlorides of the bases in an aqueous solution. In the following, a more detailed description is given for the compounds corresponding to Formulae 12 and 14.

The compound corresponding to Formula 12 is prepared as follows:

1.9 grams of the diazo sulfonate sodium salt of the 4-amino-diphenyl-amine are dissolved in 100 cc. of water, and the mixture is then mixed with a solution of 1.3 grams of aniline-hydrochloride in 8 cc. of water, while mechanically agitating. The aniline salt of the diazo sulfonate precipitates as an ochre-colored substance. After recrystallization from ethanol, to which some water was added, it melts at 158° C. with decomposition.

The compound corresponding to Formula 14 is prepared as follows:

2.97 grams of the diazo sulfonate sodium salt of the 2,5-diethoxy-4-chloro-aniline are dissolved in 330 cc. of water and then mixed with a solution of 1.15 grams of 4,4′-diamino-diphenyl-dihydrochloride in 200 cc. of water while mechanically agitating.

The diamino-diphenyl salt of the diazo sulfonate precipitates as a brownish-yellow substance. After recrystallization from ethanol, to which some water was added, it melts at 157° C. with decomposition.

This application is a continuation of copending application Serial No. 685,408, filed September 23, 1957, which in turn, is a continuation-in-part of application Serial No. 515,784, filed June 15, 1955, and now abandoned.

It will be obvious to those skilled in the art that many modifications may be made within the scope of the present invention without departing from the spirit thereof, and the invention includes all such modifications.

What is claimed is:

1. A presensitized printing plate comprising a metal base coated with a layer comprising a compound having the formula $$R—N=N—SO_3—H\cdot H_2NR_1$$

in which R and $R_1$ are aryl groups, the compound being applied to the base as a solution in an organic solvent.

2. A presensitized printing plate comprising a metal

| Diazo Sulfonate, sodium salt of— | Base | Color of the Salt | Melting Point (with decomposition) | Solvent | Color of Image | Developer |
|---|---|---|---|---|---|---|
| N-p-methoxy-phenyl-p-phenylene-diamine. | p-Ethoxy-aniline (cf. Formula 9). | Lemon-yellow. | 123° | Glycol monomethyl ether. | Yellow brown. | 0.5% aqueous solution of trisodium phosphate. |
| Do | 2,5-dimethoxy-aniline | Cocoa colored. | 159° | do | Bluish grey. | 2.5% aqueous solution of disodium phosphate. |
| N-benzoyl-o,o-dibutoxy-p-phenylene-diamine. | Benzidine (cf. Formula 10). | Eggyolk colored. | 183–184° | Glycol monomethyl ether/dimethyl formamide (5:1). | Bluish red | 1% aqueous solution of trisodium phosphate. |
| 4′-methyl-3,6-dimethoxy-4-amino-diphenylsulfide. | 1,5-diamino naphthalene (cf. Formula 11). | do | Decomposes at 105°. | Glycol monomethyl ether/dimethyl formamide (3:1). | do | 1–5% aqueous solution of trisodium phosphate or 10% sodium carbonate. |
| Do | 2′,5′:2″,5″-tetramethoxy-4′,4″-diaminotriphenylmethane. | Greenish yellow. | 125–130° turns dark. | Methyl ethyl ketone | Yellow brown. | 1–5% aqueous solution of trisodium phosphate. |
| p-Amino-diphenyl-amino. | Aniline (cf. Formula 12) | Ochre | 158° | Glycol monomethyl ether. | do | Water or 5% aqueous solution of disodium phosphate. |
| N-p-toluene sulfonyl-o,o-diethoxy-p-phenylene-diamine. | p-Diamino-benzene (cf. Formula 13). | Lemon-colored. | 172°–174° | do | Brown | Do. |
| N-p-toluene-sulfonyl-o,o-diethoxy-p-phenylene-diamine. | p-Ethoxy-aniline | Yellow | 113–117° | do | Yellow brown. | Do. |
| 2,5-diethoxy-4-chloro-aniline. | Benzidine (cf. Formula 14). | Lemon-colored. | 157° | do | Greyish blue. | 5% aqueous solution of disodium phosphate or 1% solution (aqueous) of trisodium phosphate. |
| Do | p-Amino-benzoic acid ethyl ester. | do | 148–150° | do | Bluish red | Water or 5% aqueous solution of disodium phosphate. |
| Do | 1,2,3,4,-tetrahydro-2-amino naphthalene (see Formula 15). | Yellow | 174° | Ethylene glycol monomethylether. | Yellow brown. | Water. |

base coated with a layer comprising a compound having the formula

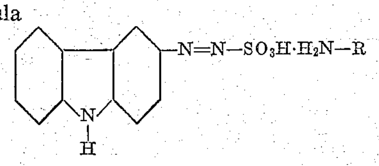

in which R is an aryl group, the compound being applied to the base as a solution in an organic solvent.

3. A presensitized printing plate comprising a metal base coated with a layer comprising a compound having the formula

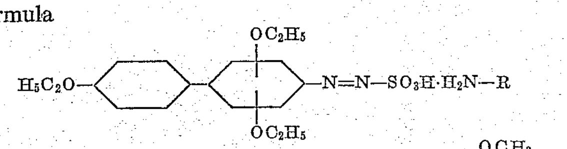

in which R is an aryl group, the compound being applied to the base as a solution in an organic solvent.

4. A presensitized printing plate comprising a metal base coated with a layer comprising a compound having the formula

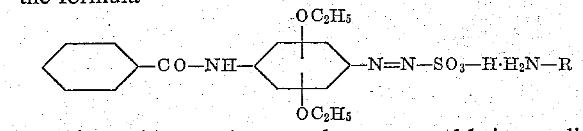

in which R is an aryl group, the compound being applied to the base as a solution in an organic solvent.

5. A presensitized printing plate comprising a metal base coated with a layer comprising a compound having the formula

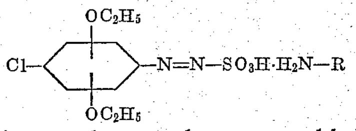

in which R is an aryl group, the compound being applied to the base as a solution in an organic solvent.

6. A presensitized printing plate comprising an aluminum base coated with a layer comprising a compound having the formula

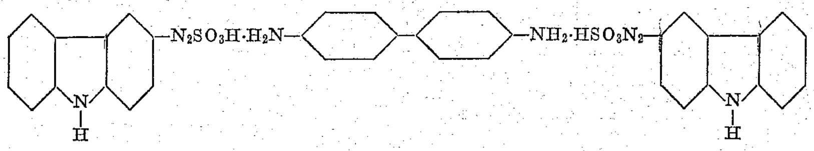

the compound being applied to the base as a solution in an organic solvent.

7. A presensitized printing plate comprising an aluminum base coated with a layer comprising a compound having the formula

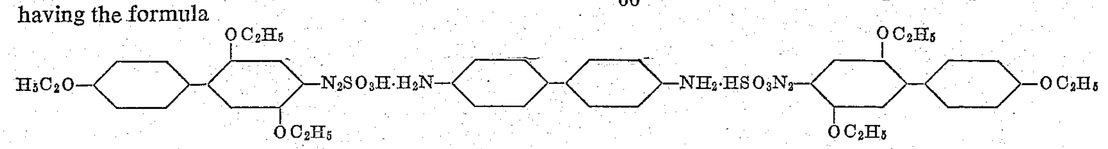

the compound being applied to the base as a solution in an organic solvent.

8. A presensitized printing plate comprising an aluminum base coated with a layer comprising a compound having the formula

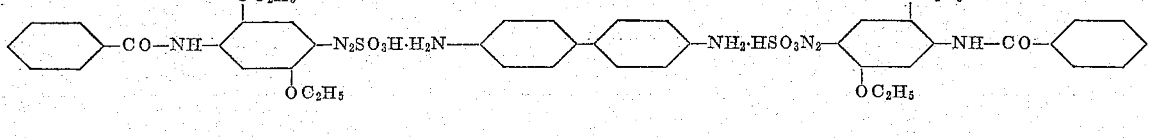

the compound being applied to the base as a solution in an organic solvent.

9. A presensitized printing plate comprising an aluminum base coated with a layer comprising a compound having the formula

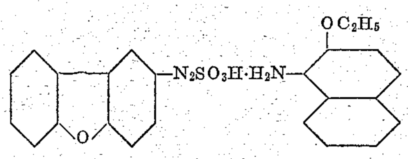

the compound being applied to the base as a solution in an organic solvent.

10. A presensitized printing plate comprising an aluminum base coated with a layer comprising a compound having the formula

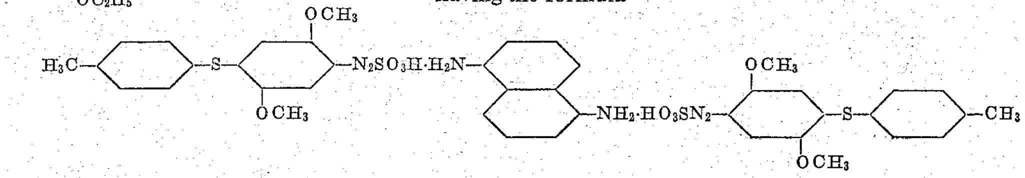

the compound being applied to the base as a solution in an organic solvent.

11. A presensitized printing plate according to claim 1 in which the metal base is an aluminum sheet.

12. A presensitized printing plate comprising an aluminum base coated with a layer comprising a compound having the formula

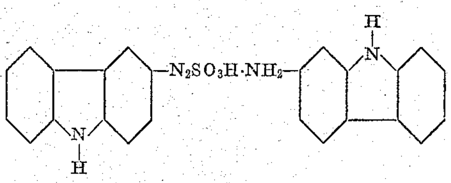

the compound being applied to the base as a solution in an organic solvent.

13. A presensitized printing plate comprising an aluminum base coated with a layer comprising a compound having the formula

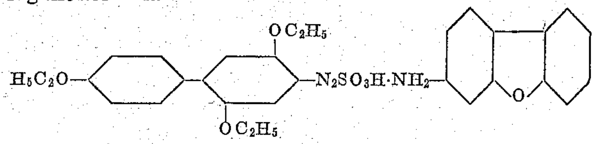

the compound being applied to the base as a solution in an organic solvent.

14. A presensitized printing plate comprising an aluminum base coated with a layer comprising a compound having the formula

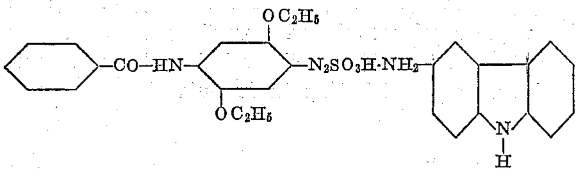

the compound being applied to the base as a solution in an organic solvent.

15. A presensitized printing plate comprising an aluminum base coated with a layer comprising a compound having the formula

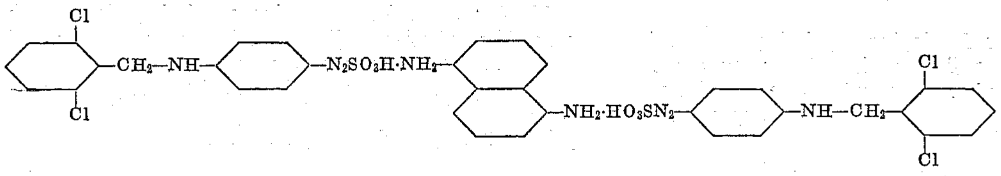

the compound being applied to the base as a solution in an organic solvent.

16. A presensitized printing plate comprising an aluminum base coated with a layer comprising a compound having the formula

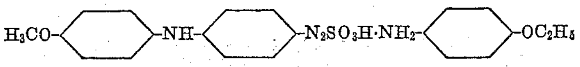

the compound being applied to the base as a solution in an organic solvent.

17. A presensitized printing plate comprising an aluminum base coated with a layer comprising a compound having the formula

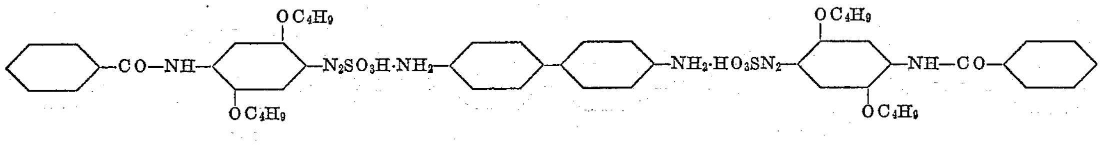

the compound being applied to the base as a solution in an organic solvent.

18. A presensitized printing plate comprising an aluminum base coated with a layer comprising a compound having the formula

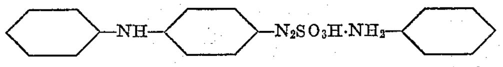

the compound being applied to the base as a solution in an organic solvent.

19. A presensitized printing plate comprising an aluminum base coated with a layer comprising a compound having the formula

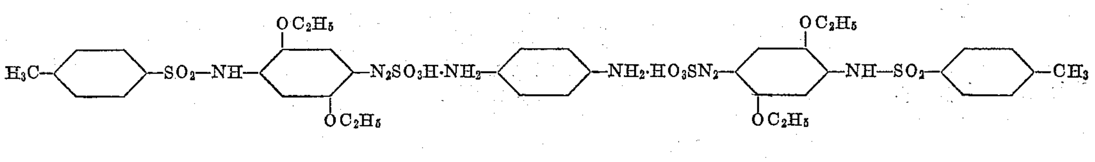

the compound being applied to the base as a solution in an organic solvent.

20. A presensitized printing plate comprising an aluminum base coated with a layer comprising a compound having the formula

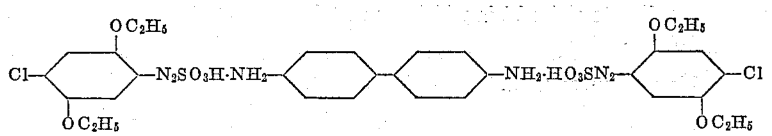

the compound being applied to the base as a solution in an organic solvent.

21. A presensitized printing plate comprising an aluminum base coated with a layer comprising a compound having the formula

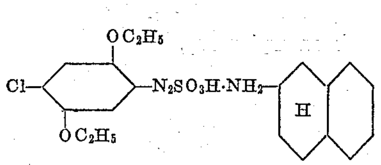

the compound being applied to the base as a solution in an organic solvent.

22. A process for developing a printing plate which comprises exposing a light-sensitive layer, on a metal base, to light under a master and treating the exposed layer with a solvent selected from the group consisting of water and a weakly alkaline solution, the layer comprising a compound having the formula $$R{-}N{=}N{-}SO_3H.H_2NR_1$$

in which R and $R_1$ are aryl groups.

23. A process for developing a printing plate which comprises exposing a light-sensitive layer, on a metal base, to light under a master and treating the exposed layer with a solvent selected from the group consisting of water and a weakly alkaline solution, the layer comprising a compound having the formula

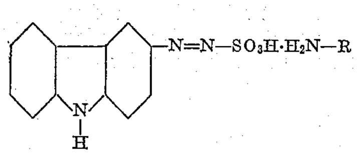

in which R is an aryl group.

24. A process for developing a printing plate which comprises exposing a light-sensitive layer, on a metal base, to light under a master and treating the exposed layer with a solvent selected from the group consisting of water and a weakly alkaline solution, the layer comprising a compound having the formula

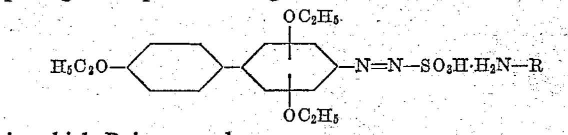

in which R is an aryl group.

27. A process for developing a printing plate which comprises exposing a light-sensitive layer, on a metal base, to light under a master and treating the exposed layer with a solvent selected from the group consisting of water and a weakly alkaline solution, the layer comprising a compound having the formula

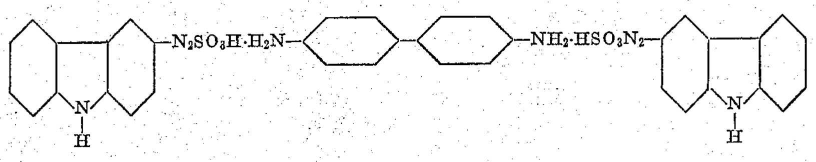

25. A process for developing a printing plate which comprises exposing a light-sensitive layer, on a metal base, to light under a master and treating the exposed layer with a solvent selected from the group consisting 28. A process for developing a printing plate which comprises exposing a light-sensitive layer, on a metal base, to light under a master and treating the exposed layer with a solvent selected from the group consisting of water and a weakly alkaline solution, the layer comprising a compound having the formula

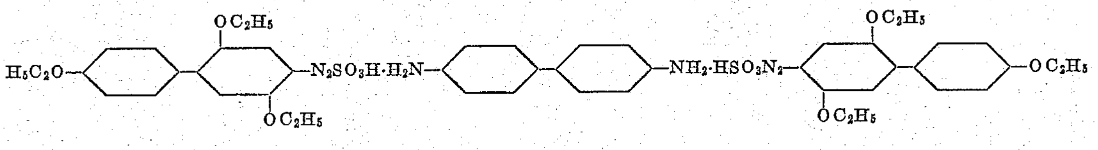

of water and a weakly alkaline solution, the layer comprising a compound having the formula

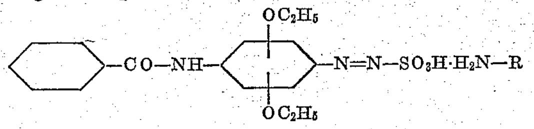

in which R is an aryl group.

29. A process for developing a printing plate which comprises exposing a light-sensitive layer, on a metal base, to light under a master and treating the exposed layer with a solvent selected from the group consisting of water and a weakly alkaline solution, the layer comprising a compound having the formula

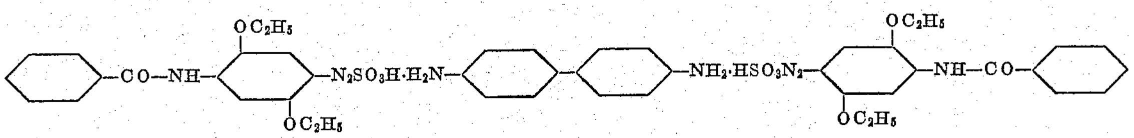

26. A process for developing a printing plate which comprises exposing a light-sensitive layer, on a metal base, to light under a master and treating the exposed layer with a solvent selected from the group consisting of water and a weakly alkaline solution, the layer comprising a compound having the formula

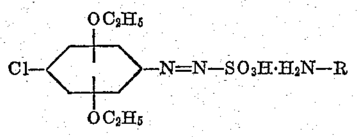

in which R is an aryl group.

30. A process for developing a printing plate which comprises exposing a light-sensitive layer, on a metal base, to light under a master and treating the exposed layer with a solvent selected from the group consisting of water and a weakly alkaline solution, the layer comprising a compound having the formula

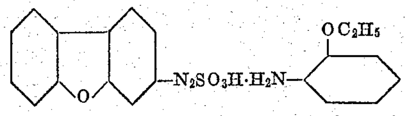

31. A process for developing a printing plate which comprises exposing a light-sensitive layer, on a metal base, to light under a master and treating the exposed layer with a solvent selected from the group consisting of water and a weakly alkaline solution, the layer comprising a compound having the formula

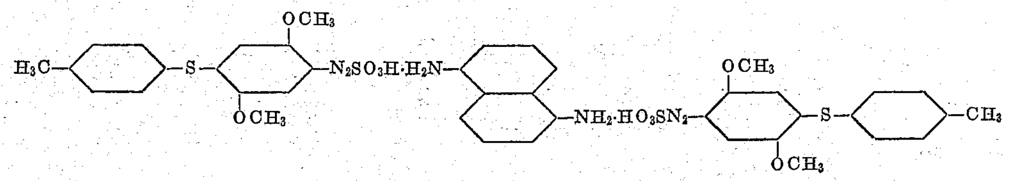

32. A process according to claim 22 in which the metal base is an aluminum sheet.

No references cited.